United States Patent [19]

Nishikawa et al.

[11] 4,147,428
[45] Apr. 3, 1979

[54] DEVICE FOR POSITIONING FILMS ON BASE SHEETS

[75] Inventors: Yukio Nishikawa; Yoshio Ono; Fumihiko Nishida, all of Kyoto, Japan

[73] Assignee: Dainippon Screen Seizo Kabushiki Kaisha, Japan

[21] Appl. No.: 872,089

[22] Filed: Jan. 25, 1978

[30] Foreign Application Priority Data

Jan. 25, 1977 [JP] Japan .................................. 52-7531

[51] Int. Cl.² .............................................. G03B 27/04
[52] U.S. Cl. .................................. 355/88; 355/102; 355/113
[58] Field of Search ................... 355/88, 113, 102, 12, 355/86, 95

[56] References Cited

U.S. PATENT DOCUMENTS

| | | | |
|---|---|---|---|
| 3,090,288 | 5/1963 | Wagner | 355/88 X |
| 3,198,103 | 8/1965 | Malloy et al. | 355/88 |
| 3,873,202 | 3/1975 | Inone | 355/88 |

FOREIGN PATENT DOCUMENTS 2306941  9/1974  Fed. Rep. of Germany ............. 355/88

*Primary Examiner*—Richard A. Wintercorn
*Attorney, Agent, or Firm*—Holman & Stern

[57] ABSTRACT

A positioning device is disclosed, designed for use in the color separation plate making industry, whereby several sets of original films may be mounted on base sheets, each member of a set being mounted on a different base sheet in the same position relative to the members of the other sets. The invention employs a rotating frame which has several faces on which base sheets are mounted, and incorporates a positioning device adapted to locate original films accurately at corresponding positions on the different faces. Thus the invention achieves its desired result accurately, conveniently, and cheaply.

7 Claims, 6 Drawing Figures

DEVICE FOR POSITIONING FILMS ON BASE SHEETS

The present invention relates to a device for positioning films, such as color separation films used in multi-color printing, on transparent base sheets according to a desired layout.

As is well known, color printing is performed by superimposing different colored inks by employing a plurality of printing plates which are produced by separating an original picture into several colors; for example, cyan, magenta, yellow, and black.

When a printing layout includes several pictures, each picture is generally color-separated independently and color separation films of each picture are made separately. Then the color separation films for each color are collated and mounted on a transparent base and are printed in contact with a printing plate material such as a pre-sensitized plate to obtain an original color separation plate for printing of the desired layout.

It is essential that the various color plates print precisely in coincidence, to prevent "color mackle", which would otherwise impair the printing quality, and thus critical that the relative positions of the various pictures, mounted on the layouts for each color, exactly correspond. Hitherto, several methods have been developed for performing the positioning operation of mounting the color separation films on the layouts, and a summary of some of these known methods will now be given.

In the first method, which is at present the most frequently used, position lines for the original films are drawn on a backing sheet of the necessary size, according to the desired layout. A transparent base is overlaid on the backing sheet and then for one of the separation colors, the separation films for each picture are laid individually on the transparent base by adjusting registration marks on the films to coincide with marks on the backing sheet by eye and are secured to the transparent base by adhesive tape, to obtain a first original color separation plate. This process is repeated for each color to obtain all of the original color separation plates.

By this method, however, the accuracy of the setting positions of the films depends on the skill and care of an operator and accordingly it is unstable. Furthermore, the operation speed is low.

In a second known method, the transparent bases for each color, and the original color separation films are provided with punched apertures and the positioning of the color separation films on the transparent bases is effected by inserting registering pins into the punched apertures.

In this method, for instance, when four color inks are used for printing, four transparent bases (one for each color) are put on the backing sheet and the four original color separation films of each picture are placed on the four transparent bases one by one, according to the desired layout. Then the four transparent bases and each set of four color separation films are punched all together in a single operation, and then separated one from another. The transparent base and the color separation films of each color, which are re-collated, are positioned by using the register pins, as mentioned above. In practice, however, this method is prone to errors due to slippage when the eight film sheets are punched together. If, for example, the operator uses a hand-held power drill for the punching operation, which is convenient in a plate-making factory, it is fairly difficult to maintain a position perpendicular to the film sheets, so errors in the alignment of the apertures in the film sheets are liable to occur. Furthermore, the operation of inserting and removing the registering pins is troublesome and time consuming.

A third method known comprises detecting the positions of the register marks of the original films by photoelectric means and automatically moving the original films to the correct positions if the register marks are out of alignment. However, this method requires a large system and accordingly high costs are involved.

A fourth method uses a control machine having a memory, and a pin-bar, having a pair of standing pins for locating an original color separation film, capable of moving upward and downward and right and left over the setting surface for the color separation films. The method comprises locating first the color separation films of one color in the desired positions by locating the color separation films for each picture in turn to the pin-bar, moving the pin-bar to the desired alignment on the layout, and then storing the position of the color separation film into the memory, and finally repeating the setting operation for the color separation films of the other colors by utilizing the stored data in the memory. This method enables accurate positioning of the original films and is highly practicable but again involves high cost.

It is an object of the present invention to provide a device for positioning films on base sheets which is free from the abovementioned defects, and which is of simple construction, and which enables quick and accurate positioning of the films at lower cost.

This object is accomplished according to the present invention by a device for positioning films on base sheets, comprising:

a fixed frame;

a rotary frame mounted in the fixed frame so as to be rotatable about an axis, and having a plurality of faces adapted to support base sheets;

a positioning means for the rotary frame adapted to rotate and stop the rotary frame and to maintain the rotary frame in any one of a plurality of pre-determined positions; and a movable setting device incorporating a film locating means, said movable setting device being adjustably mounted to the fixed frame, and adapted to hold a film whcih is being located by the film locating means on a face of the rotary frame when this is being maintained in one of its pre-determined positions, and further adapted to preserve its position and orientation relative to the fixed frame while the rotary frame is rotated to a different pre-determined position.

The present invention will now be described in more detail with reference to two preferred embodiments, illustrated in the accompanying drawings, in which.

Figure 1:
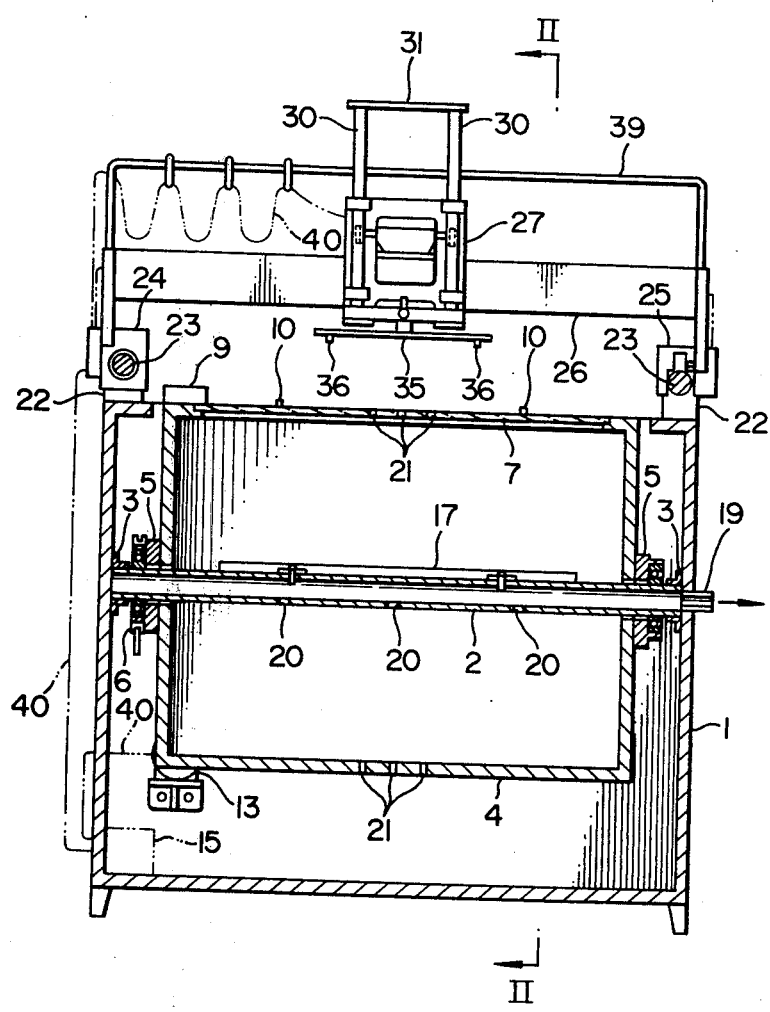
FIG. 1 is a central sectional elevational view of a first embodiment of the device for positioning films on base sheets according to the present invention.

Referring to FIGS. 1 to 4 of the drawings, the first embodiment has a fixed frame 1 in which a horizontal pipe shaft 2 is mounted by a pair of bearings 3. A rotary frame 4 for holding transparent film sheets, having a rectangular solid box form with square end faces, is rotatably supported by the pipe shaft 2 by means of a pair of bearings 5.

A pulley 6 is secured to one of the bearings 5, the pulley 6 rotating the rotary frame 4 in the direction of the arrow C, and being driven by a drive means 11 mounted to the frame 1, via a belt 12.

The rotary frame 4 includes four rectangular panel surfaces of the same shape; one of the rectangular panel surfaces comprises a frosted glass panel 7, affixed by retainers 8. Each panel surface includes a perpendicularly projecting stop plate 9 at one of its corners, and a pair of register pins 10 for locating the backing sheet and the transparent film sheets in similar positions on the panel surfaces.

A stop means 13 is mounted to the frame 1, and includes a plunger 13a which projects and engages the stop plate 9, thereby stopping the rotary frame 4 so that the uppermost panel surface is horizontal. In this embodiment, an air turbine and an air cylinder are used for the drive means 11 and the stop means 13, respectively, and are actuated by compressed air from a compressor 14 via a control valve 15. Of course, other means such as an electric motor and an electromagnetic solenoid device may be used for the drive means 11 and the stop means 13, respectively.

Light sources 17 are mounted to the pipe shaft 2 in the rotary frame 4 by arms 16 and illuminate the frosted glass panel from inside.

A suction pipe 19, which is adjacent to one end of the pipe shaft 2 and projects to the outside of the frame 1, is connected to a vacuum pump (not shown). The air in the rotary frame 4 can be evacuated by the vacuum pump through perforations 20 in the pipe shaft 2. Suction openings 21 for holding film sheets to the panel surfaces of the rotary frame 4 are provided therein at their central portions.

A pair of horizontal guide bars 23 perpendicularly skew to the pipe shaft 2 are mounted on opposite edges of the frame 1, each by a pair of bearings 22. A pair of moving members 24 and 25 arranged on the pair of guide bars 23 and movable along the guide bars 23, and a support bar 26 which couples the pair of moving members 24 and 25, constitute a support table. Each moving member 24 or 25 includes an air brake which is actuated by the air supplied from the control valve 15 and which may stop and fix the support table at any desired position.

Figure 2:
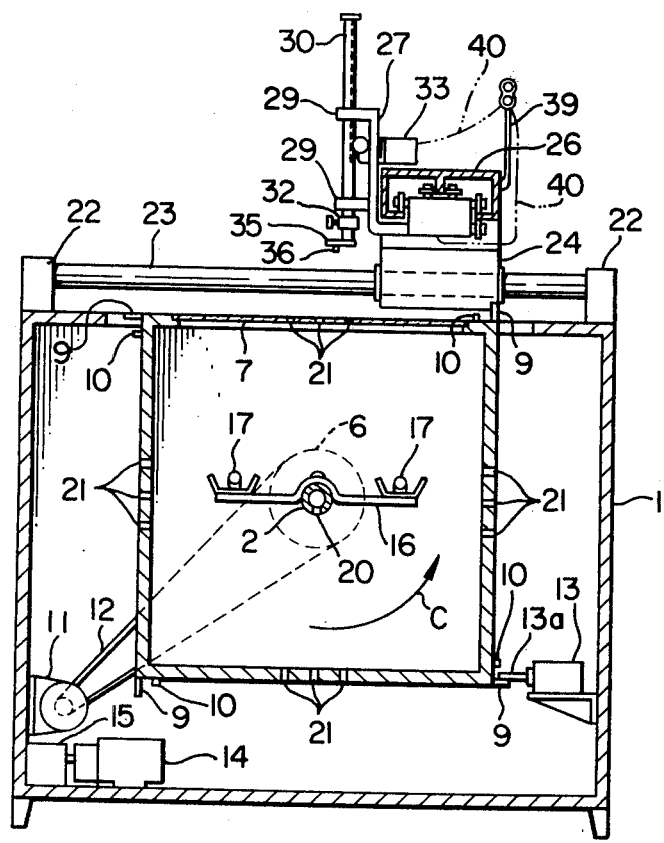
FIG. 2 is a longitudinal sectional view of the first embodiment taken along the line II—II in FIG. 1.
Figure 3:
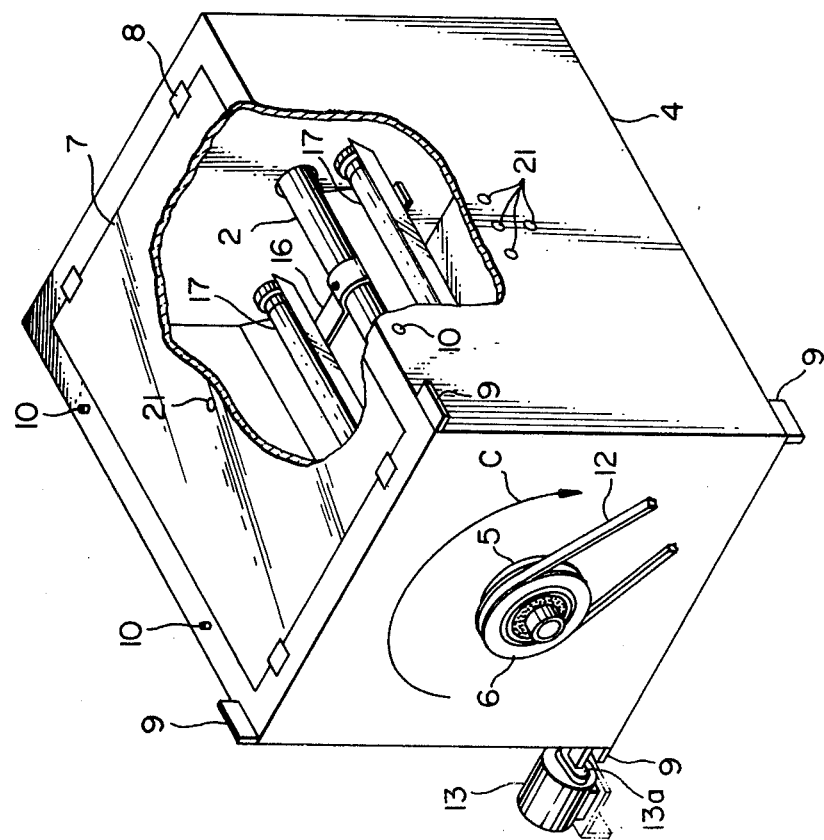
FIG. 3 is a perspective view of a rotary frame used in the embodiment of FIG. 1.
Figure 4:
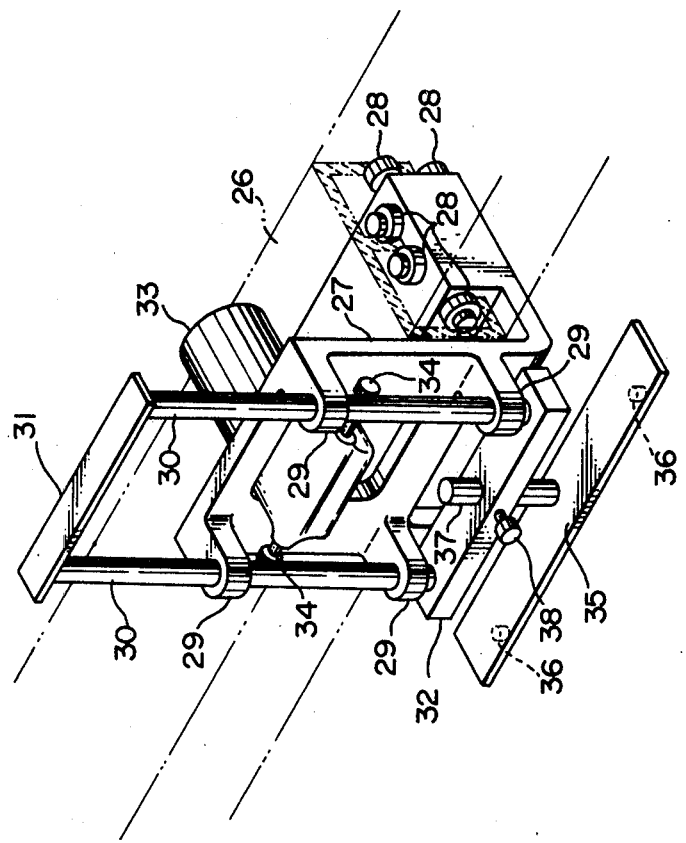
FIG. 4 is a perspective view of a moving stand used in the embodiment of FIG. 1.

A moving stand 27, having a plurality of wheels is movably mounted on the support bar 26 which has a cross-section of a downward facing E, by contacting the wheels to the support bar 26, as shown in FIGS. 2 and 4. The moving stand 27 includes an air brake adapted to stop and fix the moving stand 27 at any desired position.

The moving stand 27 has two vertically disposed pairs of bearings 29 at its front portion. A pair of vertical rack shafts 30, movable up and down, are located in the bearings 29 and are coupled to each other by a link plate 31 at their top ends and by a pin-bar holder 32 at their lower ends. The vertical rack shafts 30 are moved up and down by a pair of pinions 34 which engage with the rack shafts 30. The pinions are driven via a reduction gear means by an air turbine 33 mounted to the moving stand 27. The air turbine 33 is driven by the compressed air supplied from the control valve 15.

The pin-bar holder 32 is provided with a round hole at its center, in which a vertical shaft 37 is inserted, the vertical shaft 37 being mounted on a pin-bar 35 at its enter. The vertical shafts 37 is fixed to the pin-bar holder 32 by a screw 38. The pin-bar 35 includes a pair of register pins 36 facing downward, which are adapted to locate color separation films.

The pin-bar 35 is moved up and down with the movement of the rack shafts 30 by the turbine 33. In its lowest possible position, the pin-bar 35 contacts with the panel surface of the rotary frame 4, whereas in its highest possible position, the pin-bar 35 does not obstruct the rotation of the rotary frame 4.

A support frame 39 for an air hose 40 for the air turbine 33 is mounted to the moving stand 27.

An example of the operation of the positioning device of the present invention described above will now be described.

A master sheet on which set position lines of the color separation films have been drawn according to the desired printing layout, is mounted on the surface of the frosted glass panel 7 of the rotary frame 4, the rotary frame 4 being arranged in a position so that the frosted glass panel faces upwards and being fixed by the stop means 13. The positioning of the master sheet is carried out by engaging register pin holes of the master sheet with the register pins 10 of the rotary frame 4.

The master sheet is fixed to the panel surface by adhesive tape at intervals around its periphery. Four transparent bases, each having register pin holes adapting to the register pins 10, are positioned by the register pins 10 and mounted to the four panel surfaces of the rotary frame 4 by applying adhesive tape to the entire periphery of each transparent base.

The vacuum pump is then switched on and the air between each transparent base and each panel surface is evacuated by the vacuum pump via the suction pipe 19, the perforations 20 and the suction openings 21 so that the transparent bases are forced to contact closely to the panel surfaces without allowing shifting of the transparent base when it faces downwards.

In this case, since the master sheet is interposed between one of the transparent bases and the frosted glass panel 7, it will be seen that the contact of the transparent base to the panel surface may be unsatisfactory. However, this problem may be substantially overcome by applying adhesive tape to the periphery of the master sheet at intervals only, as described above, or by providing air perforations in the master sheet in pertinent portions where the air perforations do not obstruct the setting of the color separation films, thereby obtaining substantially sufficient contact therebetween.

When each of the several groups of original color separation films comprising one set of colors such as cyan, magenta, yellow and black are processed, they are furnished with register pin holes adapting to the register pins 36 of the pin-bar 35 at corresponding positions.

The rotary frame 4 is first so fixed that the panel surface with the master sheet is positioned at the top. The color separation film for the first picture of the first color, e.g. cyan, is located to the pin-bar 35. The pin-bar 35 is then moved down so as to contact with the transparent base mounted to the rotary frame 4 by driving the air turbine 33.

The support table and the moving stand 27 are moved and the pin-bar 35 is turned around the vertical shaft 27 so that the color separation film located to the pin-bar 35 may be positioned to the setting lines of the master sheet and adjusted to the desired position. Then the support table and the moving stand 27 are stopped and fixed by actuating the air brakes thereof. The color separation film is mounted on the transparent base by adhesive tape.

At this point, the side opposite to the pin-bar side of the color separation film is first fixed to the transparent base by adhesive tape, then the pin-bar is removed from the color separation film and moved up. The color separation film is then attached to the transparent base by applying adhesive tape to the remainder of the periphery of the color separation film. The register pins 36 of the pin-bar 35 face downward in order to conduct this operation easily.

After mounting the first color separation film of the first picture, the rotary frame 4 is rotated through 90° and the second color separation film of the first picture, magenta, for example, is mounted on the transparent base in the same manner as described above, after again moving down the pin-bar 35 to the corresponding position on the second panel surface of the rotary frame 4.

Next, the color separation films of the third and fourth colors, yellow and black in this example, for the first picture are mounted in sequence on the transparent bases in the same manner as hereinbefore described.

After setting the first color separation films of the four colors, the rotary frame 4 is further rotated through 90°, with the result that the panel surface with the color separation film of the first color, cyan, is turned back to the top position. Then, the air brakes of the support table and the moving stand 27 are released. The color separation films of the second picture for the colors, i.e. cyan, magenta, yellow and black are now mounted one by one on each of the transparent bases in the same manner as described above. Then, for the subsequent pictures in turn, the color separation films of the four colors are mounted on each of the transparent bases in the same manner as hereinbefore described, resulting in the completion of the setting of the color separation films according to the desired layout.

Since the support table and the moving stand 27 are fixed by the air brakes thereof for the duration of the operation of mounting the color separation films of the four colors for each picture, the pin-bar 35 is maintained in the same position and thus the color separation films of the four colors are mounted at corresponding positions. Consequently, the plurality of color separation films of each color, mounted on each transparent base are arranged in exactly the same relative positions, thereby giving the desired accurate adjustment of the color separation films.

Figure 5:
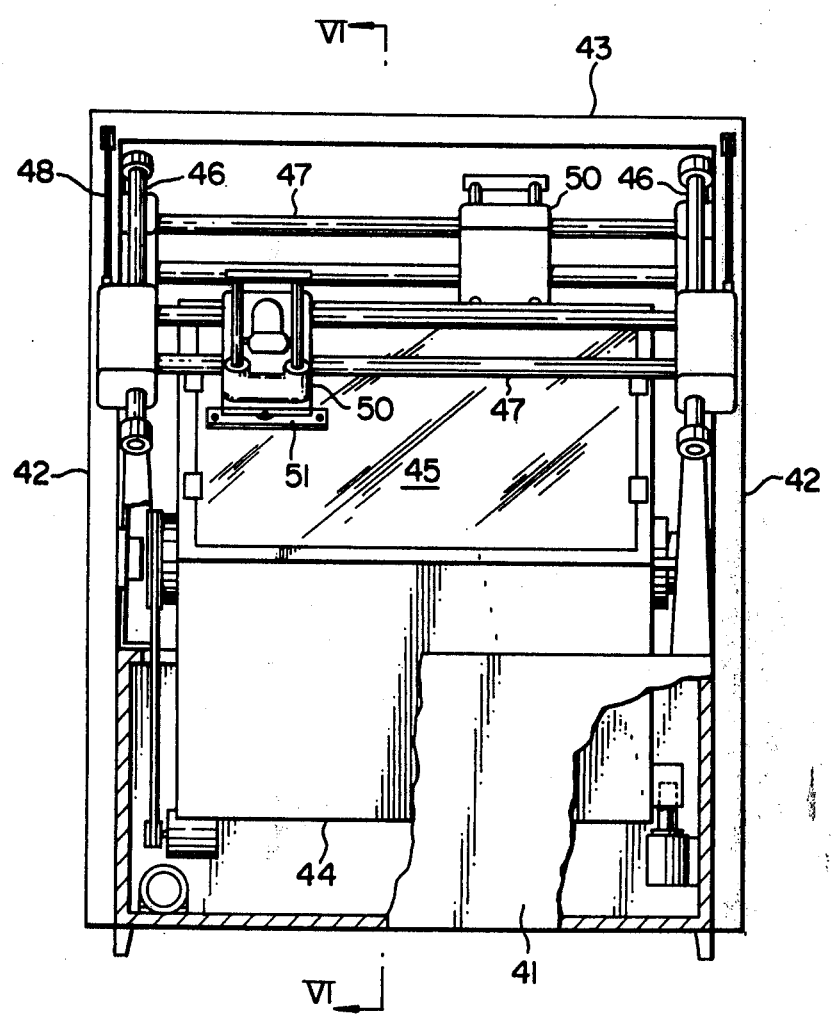
FIG. 5 is an elevational view, partly broken, of a second embodiment of the device for positioning films on base sheets according to the present invention.
Figure 6:
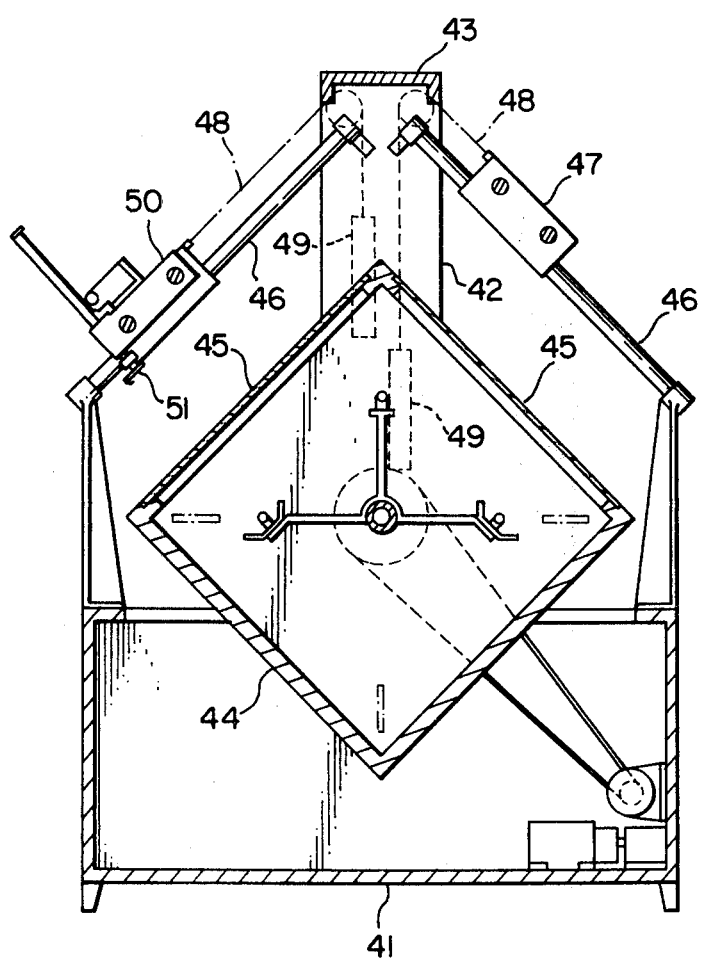
FIG. 6 is a longitudinal sectional view of the embodiment of FIG. 5, taken along the line VI—VI in FIG. 5.

In FIGS. 5 and 6 of the drawings is shown another embodiment of the device for positioning films on base sheets, according to the present invention.

This embodiment is basically similar to the first embodiment, except that two adjacent panel surfaces of the rotary frame each include a frosted glass panel, that the pre-determined positions of the rotary frame are so arranged that the panel surfaces incline at 45° to the horizontal, and that two sets of color separation films may be simultaneously mounted in the desired positions.

A pair of supports 42 are secured to a frame 41 at both of its sides. The top ends of the supports 42 are connected to each other by a horizontal link plate 43. A rotary frame 44 including four panel surfaces, two adjacent panel surfaces each having a frosted glass panel 45, is rotatably supported by the supports 42. Two pairs of guide bars 46 are mounted between the upper parts of the supports and support plates standing on the four corners of the frame 41 so that the guide bars incline at 45° so as to be parallel each to a panel surface when the rotary frame is fixed in one of its pre-determined positions. A pair of support tables 47 are movably mounted to each pair of guide bars 46. Each support table 47 is pulled upward by a pair of balance weights 49 suspended in the supports 42 via ropes 48 which couple the balance weights 49 to the support table 47. A moving stand 50 is movably mounted to each support table 47. The moving stand 50 includes a pin-bar 51. The structures and the functions of the member are the same as those of the corresponding members in the first embodiment.

With this second embodiment, two operators may each take over a portion of the operation, and accordingly, the operation time may be reduced by as much as half when compared with the first embodiment.

In both of the embodiments described above, the master sheet is mounted on the frosted glass panel, which is translucent, but however, an opaque panel surface may be used, depending on the color of the setting lines of the original films. In this case, the light from the outside is reflected from the panel surface and hence the operator can see the setting lines of the master sheet. Accordingly, there is then no need of the light source 17 inside the rotary frame 4 or 44.

Further, the rotary frame 4 or 44 may be any right regular polygonal prism such as a pentagonal prism, a hexagonal prism, and so forth, in which the panel surfaces comprise the sides thereof. It may even indeed have an irregular shape, provided that it is furnished with a plurality of faces of corresponding shape, circumferentially spaced in corresponding orientations.

From the above descriptions, it will be readily understood that according to the present invention is obtained a device for positioning films on base sheets having a simple construction and enabling quick and accurate positioning of the films to be performed at low cost. It will also be understood, that while the operation of the invention has been described with respect to its use for assembling color-separation films on transparent bases, the invention may be used for a wide range of applications involving the setting up of several exactly corresponding layouts.

Furthermore, although the invention has been described in terms of two embodiments thereof, these are not to be taken as limitative of the invention, and it will be clear to those skilled in the art that minor changes and omissions in the form and detail thereof may be made without departing from the scope of the invention.

What is claimed is:

1. A device for positioning films on base sheets, comprising:
    a fixed frame;
    a rotary frame mounted in the fixed frame so as to be rotatable about an axis, and having a plurality of faces adapted to support base sheets;
    a positioning means for the rotary frame adapted to rotate and stop the rotary frame and to maintain the rotary frame in any one of a plurality of pre-determined positions; and a movable setting device incorporating a film locating means, said movable setting device being adjustably mounted to the fixed frame, and adapted to hold a film which is being located by the film locating means on a face of the rotary frame when this is being maintained in one of its pre-determined positions, and further adapted to preserve its position and orientation relative to the fixed frame while the rotary frame is rotated to a different pre-determined position.

2. A positioning device according to claim 1 in which the rotating frame has the form of a right regular polygonal prism which is rotatable about its axis of symmetry.

3. A positioning device according to claim 1 in which at least one of the faces of the rotary frame has the form of a translucent panel and in which a light source is incorporated within the rotary frame.

4. A positioning device according to claim 1, in which none of the faces of the rotary frame is translucent.

5. A positioning device according to claim 1, wherein the film locating means of the movable setting device comprises a pin-bar.

6. A positioning device according to claim 1, including at least two movable setting devices and at least two film locating means.

7. A positioning device according to claim 1, wherein faces of the rotary frame include suction perforations in their center portions, and wherein evacuating means are provided adapted to suck and hold the base sheets to faces of the rotary frame.

* * * * *